(12) United States Patent
Iwashina et al.

(10) Patent No.: US 11,087,811 B1
(45) Date of Patent: Aug. 10, 2021

(54) NVM SYNAPTIC ELEMENT WITH GRADUAL RESET CAPABILITY

(71) Applicant: INTERNATIONAL BUSINESS MACHINES CORPORATION, Armonk, NY (US)

(72) Inventors: Akiyo Iwashina, Tokyo (JP); Atsuya Okazaki, Tokyo (JP); Takeo Yasuda, Nara (JP)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 16/885,618

(22) Filed: May 28, 2020

(51) Int. Cl.
*G11C 11/16* (2006.01)
*H01L 27/22* (2006.01)
*H01L 45/02* (2006.01)

(52) U.S. Cl.
CPC .......... *G11C 11/165* (2013.01); *G11C 11/161* (2013.01); *H01L 27/222* (2013.01); *H01L 45/02* (2013.01)

(58) Field of Classification Search
None
See application file for complete search history.

(56) References Cited

U.S. PATENT DOCUMENTS

| | | | |
|---|---|---|---|
| 6,385,082 B1 | 5/2002 | Abraham et al. | |
| 7,154,773 B2 | 12/2006 | Braun et al. | |
| 8,513,749 B2 | 8/2013 | Chen et al. | |
| 2005/0180202 A1* | 8/2005 | Huai | H01L 43/08 365/171 |
| 2007/0014149 A1* | 1/2007 | Nagamine | G11C 11/1659 365/158 |
| 2007/0297222 A1* | 12/2007 | Leuschner | G11C 11/15 365/171 |

(Continued)

FOREIGN PATENT DOCUMENTS

| | | |
|---|---|---|
| DE | 102004039978 A1 | 6/2005 |
| WO | WO 2017183573 A1 | 10/2017 |

OTHER PUBLICATIONS

Carstens, "MRAM with Reset Function", IP.com Prior Art Database Technical Disclosure, IP.com No. IPCOM000125700D, Jul. 2005, 2 pages.

(Continued)

*Primary Examiner* — Tan T. Nguyen
(74) *Attorney, Agent, or Firm* — Tutunjian & Bitetto, P.O.; Randall Bluestone

(57) ABSTRACT

An analog Magnetoresistive Random Access Memory (MRAM) cell is provided. The analog MRAM cell includes a magnetic free layer having a first domain having a first magnetization direction, a second domain having a second magnetization direction opposite to the first magnetization direction and a domain wall located between the first domain and the second domain. The analog MRAM cell further includes a magnetically pinned layer. The analog MRAM cell also includes an insulating tunnel barrier between the magnetic free layer and the magnetically pinned layer. The analog MRAM cell additionally includes an electrode located adjacent to the magnetic free layer configured to generate heat by supplying current to decrease a conductance of the magnetic free layer.

25 Claims, 13 Drawing Sheets

(56) References Cited

U.S. PATENT DOCUMENTS

| | | | | |
|---|---|---|---|---|
| 2012/0081950 A1* | 4/2012 | Slaughter | ............ | G11C 11/1657 365/158 |
| 2012/0106239 A1* | 5/2012 | Xi | ....................... | G11C 11/1675 365/158 |
| 2018/0350432 A1* | 12/2018 | Sasaki | ..................... | G11C 11/54 |
| 2019/0244666 A1* | 8/2019 | Hsu | ....................... | G11C 14/009 |

OTHER PUBLICATIONS

Kaushik et al., "Next Generation Spin Torque Memories", Springer Briefs in Applied Sciences and Technology, 2007, pp. 1-107.

Lankhorst, "Modelling Glass Transition Temperatures of Chalcogenide Glasses. Applied to Phase-change Optical Recording Materials", Elsevier, Journal of Non-Crystalline Solids, Feb. 2002, pp. 210-219.

Lee et al., "Highly Scalable STT-MRAM with MTJs of Top-pinned Structure in 1T/1MTJ Cell", 2010 Symposium on VLSI Technology Digest of Technical Papers, Jul. 2010, pp. 49-50.

Lequeux et al., "A Magnetic Synapse: Multilevel Spin-Torque Memristor with Perpendicular Anisotropy", Scientific Reports, Aug. 2016, pp. 1-7.

Li et al., "Temperature Dependence on the Contact Size of GeSbTe Films for Phase Change Memories", J Comput Electron, Jan. 2008, pp. 138-141.

Metaxas et al., "Creep and Flow Regimes of Magnetic Domain-Wall Motion in Ultrathin Pt/Co/Pt Films with Perpendicular Anisotropy", The American Physical Society, Physical Review Letters, Nov. 2007, pp. 1-4.

Nirschl et al., "Write Strategies for 2 and 4-bit Multi-Level Phase-Change Memory", IEEE, Dec. 2007, pp. 461-464.

Prejbeanu et al., "Thermally Assisted MRAMs: Ultimate Scalability and Logic Functionalities", J. Phys. D: Appl. Phys, Jan. 2013, 17 pages.

\* cited by examiner

NVM SYNAPTIC ELEMENT WITH GRADUAL RESET CAPABILITY

BACKGROUND

The present invention relates generally to memory devices and, in particular, to a non-volatile memory synaptic element with a gradual RESET capability.

An analog multiply-add accelerator using non-volatile memory (NVM) has been attracting great interest as a way of achieving very low power consumption. For use in an analog synaptic element in an analog multiply-add accelerator, various NVM types such as Phase Change Memory (PCM), Resistive Random Access Memory (RRAM), Magnetoresistive Random Access Memory (MRAM), and so forth are under serious study. Although each NVM type has advantages and disadvantages, a significant advantage of MRAM is that allows for a symmetric SET(conductance increase)/RESET(conductance decrease) operation.

However, when MRAM is used as an analog synaptic element, there is a problem as follows: when a SET operation is applied sometimes the SET operation exceeds its upper limit, and it is not easy to decrease the conductance. The conventional RESET method of using a static magnetic field has the following disadvantages: (1) a strong magnetic field is necessary; and (2) the RESET method is forcibly applied to all synaptic elements.

Moreover, when MRAM is used as an analog synaptic element, (1) the same cannot be integrated into Large Scale Integration (LSI) circuits and (2) the RESET operation cannot be applied with a selected synaptic element (but must be applied to all synaptic elements).

SUMMARY

In accordance with embodiment of the present invention, an analog Magnetoresistive Random Access Memory (MRAM) cell is provided. The analog MRAM cell includes a magnetic free layer having a first domain having a first magnetization direction, a second domain having a second magnetization direction opposite to the first magnetization direction and a domain wall located between the first domain and the second domain. The analog MRAM cell further includes a magnetically pinned layer. The analog MRAM cell also includes an insulating tunnel barrier between the magnetic free layer and the magnetically pinned layer. The analog MRAM cell additionally includes an electrode located adjacent to the magnetic free layer configured to generate heat by supplying current to decrease a conductance of the magnetic free layer.

In one or more embodiment of the present invention, the analog MRAM cell is included in a synaptic element.

In one or more embodiments of the present invention, the electrode decreases the conductance of the magnetic free layer of only the synaptic element from among a plurality of synaptic elements.

In one or more embodiments of the present invention, the analog MRAM further includes selection circuitry configured to select only the synaptic element for a conductance decrease from among the plurality of synaptic elements.

In one or more embodiments of the present invention, the electrode is configured to generate heat by supplying the current to decrease the conductance of the magnetic free layer to randomize a magnetization direction of at least a portion of the magnetic free layer.

In one or more embodiments of the present invention, a generation of heat from the electrode creates a local magnetic field only in the analog MRAM cell from among a plurality of MRAM cells forming a memory array.

According to other aspects of the present invention, a method is provided for resetting an analog MRAM. The method includes detecting a status of a magnetic free layer of the analog MRAM. The magnetic free layer has a first domain having a first magnetization direction, a second domain having a second magnetization direction opposite to the first magnetization direction and a domain wall located between the first domain and the second domain. A detection status is based on the first and second magnetization directions being aligned and the domain wall being removed. The method further includes supplying current to an electrode to generate heat to randomize the magnetization of the cell and applying a magnetic torque to at least a heated part of magnetic free layer to reverse the magnetization directions of the heated part and form the domain wall responsive to the first and second magnetization directions being aligned and the domain wall being removed.

In one or more embodiments, the method further includes applying one or more control signals to selection circuitry configured to select only the analog NVM for a conductance decrease from among the plurality of NVMs.

In accordance with still other embodiments of the present invention, an analog Magnetoresistive Random Access Memory (MRAM) is provided. The MRAM includes a plurality of MRAM cells. Each of the plurality of cells include a magnetic free layer having a first domain having a first magnetization direction, a second domain having a second magnetization direction opposite to the first magnetization direction and a domain wall located between the first domain and the second domain. Each of the plurality of cells further include a magnetically pinned layer. Each of the plurality of cells also include an insulating tunnel barrier between the magnetic free layer and the magnetically pinned layer. Each of the plurality of cells additionally include an electrode located adjacent to the magnetic free layer configured to generate heat by supplying current to decrease a conductance of the magnetic free layer.

In one or more embodiments of the present invention, wherein each of the plurality of MRAM cells is coupled to respective heat selection circuitry for heating the electrode of a selected one or more of the plurality of MRAM cells.

In one or more embodiments of the present invention, each of the plurality of analog MRAM cells is includes in respective a synaptic element from among a plurality of synaptic elements.

In one or more embodiments of the present invention, the electrode decreases the conductance of the magnetic free layer of only selected ones of the plurality of synaptic elements.

In one or more embodiments of the present invention, the analog MRAM cell further includes selection circuitry configured to select one or more but less than all of the plurality of synaptic elements for a conductance decrease.

According to yet further aspects of the present invention, a method is provided for resetting an analog Magnetoresistive Random Access Memory (MRAM) having a plurality of MRAM cells. The method includes detecting a status of a magnetic free layer of each of the plurality of MRAM cells. The magnetic free layer has a first domain having a first magnetization direction, a second domain having a second magnetization direction opposite to the first magnetization direction and a domain wall located between the first domain and the second domain. A detection status is based on the first and second magnetization directions being aligned and the domain wall being removed. The method further includes selecting one or more of the plurality of MRAM cells for a RESET operation, responsive to detecting the first and second magnetization directions being aligned and the domain wall being removed. The method also includes supplying current to an electrode of the selected one or more of the plurality of MRAM cells to generate heat to randomize the magnetization of the cell and applying a magnetic torque to at least a heated part of magnetic free layer to reverse the magnetization directions of the heated part and form the domain wall.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
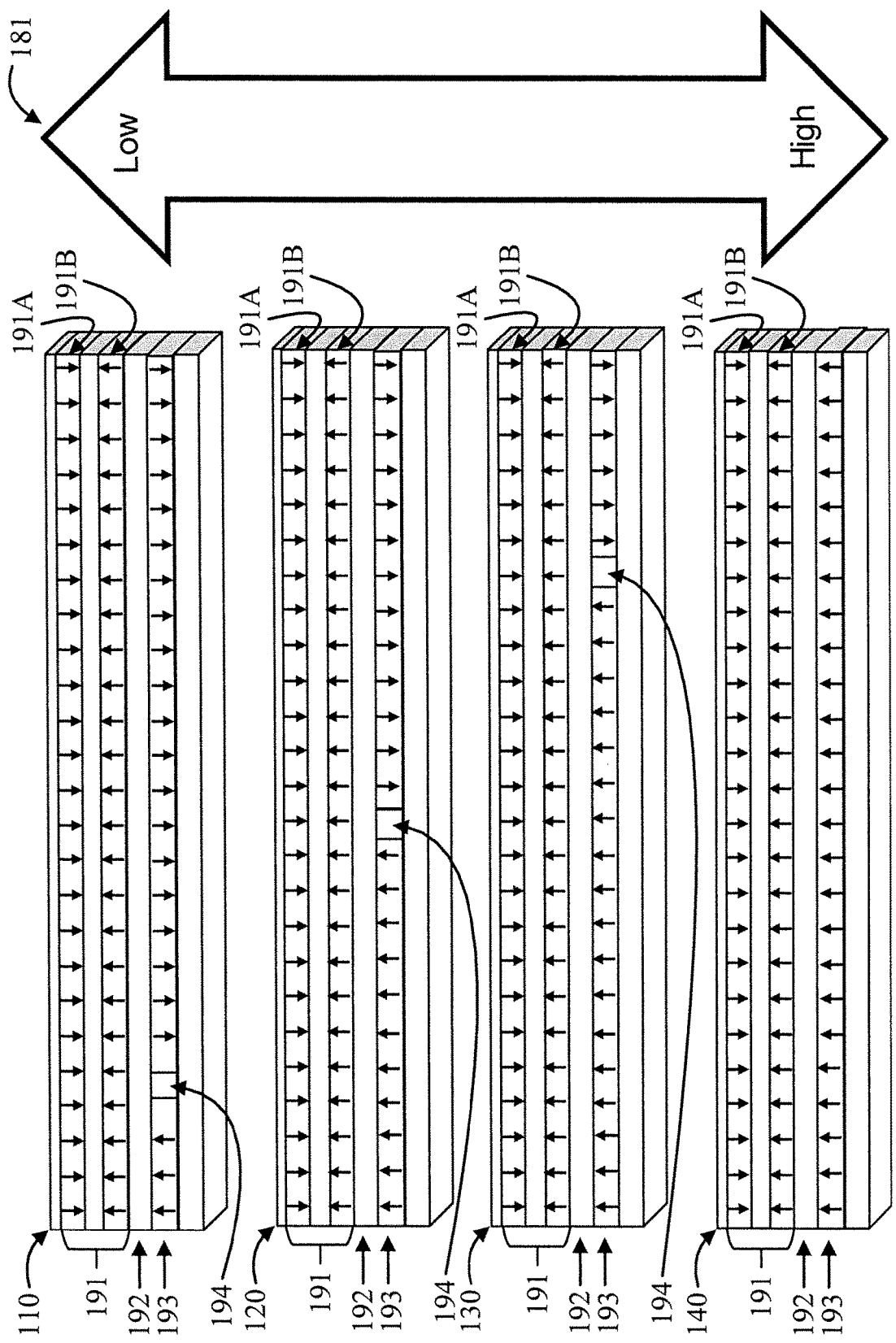
FIG. 1 is a diagram showing four exemplary conductance states of an analog MRAM cell to which the present invention can be applied.

Embodiments of the present invention are directed to a non-volatile memory synaptic element with a gradual RESET capability.

Embodiments of the present invention are capable of applying a gradual RESET operation to a selected one or more synaptic elements versus all synaptic elements as is required of the aforementioned prior art RESET approach.

Embodiments of the present invention involve placing an electrode on or adjacent to a magnetic free layer in order to generate heat in a selected synaptic element (having that magnetic free layer) and randomize magnetization in an edge of the magnetic free layer where the electrode is placed or is adjacent to.

Embodiments of the present invention can be used for deep learning.

Embodiments of the present invention can be integrated into Large Scale Integration (LSI) circuits. Generating heat and applying a magnetic torque can be realized by applying electrical signals with selected wires.

Embodiments of the present invention can be applied to a RESET operation based on Ampere's Law and spin-transfer torque principles.

Embodiments of the present invention can be applied to perpendicular-magnetized MRAM as well as horizontally-magnetized MRAM.

In order to clearly describe the present invention, a brief description will now be given regarding a MRAM cell.

Data in MRAM is stored by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. This configuration is known as a magnetic tunnel junction and is the simplest structure for an MRAM bit. A memory device is built from a grid of such "cells".

The simplest method of reading is accomplished by measuring the electrical resistance of the cell. A particular cell is (typically) selected by powering an associated transistor that switches current from a supply line through the cell to ground. Due to tunnel magnetoresistance, the electrical resistance of the cell changes with the relative orientation of the magnetization in the two plates. By measuring the resulting current, the resistance inside any particular cell can be determined, and from this the magnetization polarity of the writable plate. Typically, if the two plates have the same magnetization alignment (low resistance state) this is considered to denote a value of "1", while if the alignment is antiparallel the resistance will be higher (high resistance state) and this denotes a value of "0", although it is to be appreciated that the present invention is specifically directed to an analog output from a NVM(s) having gradual RESET resistance change such as, for example, in relation to a multiply-add operation using an analog NVM(s).

Further, in order to clearly describe the present invention, a brief description will now be given regarding a specific condition of a MRAM cell to which the present invention can be applied. The condition relates to a distribution of charge that makes decreasing conductance of the MRAM cell quite difficult in the absence of the present invention.

Referring to FIG. 1, four exemplary conductance states 110, 120, 130, and 140 of an analog MRAM cell 190 are shown to which the present invention can be applied. The example of FIG. 1 relates to a case of perpendicular-magnetized MRAM.

The analog MRAM cell 190 includes a synthetic antiferromagnetic portion 191, a tunnel barrier layer 192, a magnetic free layer 193, and a magnetic domain wall 194.

As shown by the arrow 181 on the right side, conductance increases with each state starting from the first conductance state 110 and proceeding up and through the fourth conductance state 140.

The synthetic antiferromagnetic portion 191 includes a first layer 191A over a second layer 191B. As can be seen in each of the conductance states 110 through 140, the first layer 191A and the second layer 191B have opposing magnetic directions.

Anti-ferromagnetism is a type of magnetism in solids such as manganese oxide (MnO) in which adjacent ions that behave as tiny magnets (in this case manganese ions, $Mn^{2+}$) spontaneously align themselves at relatively low temperatures into opposite, or antiparallel, arrangements throughout the material so that it exhibits almost no gross external magnetism. In antiferromagnetic materials, which include certain metals and alloys in addition to some ionic solids, the magnetism from magnetic atoms or ions oriented in one direction is canceled out by the set of magnetic atoms or ions that are aligned in the reverse direction.

The tunnel barrier layer 192 is an insulating barrier between the synthetic antiferromagnetic portion 191 and the magnetic free layer 193. Electrons pass through the tunnel barrier layer by quantum tunneling, thus imposing a magnetic field on the magnetic free layer 193.

While the first layer 191A and the second layer 191B of the synthetic antiferromagnetic portion 191 have fixed magnetic polarities, the magnetic free layer 193 has changeable magnetic polarities. Upon application of a magnetic field of appropriate strength, the magnetic free layer 193 switches polarity, producing two distinct states: a parallel, low-resistance state; and an antiparallel, high-resistance state. Thus, the first layer 191A and the second layer 19B of the synthetic antiferromagnetic portion 191 are considered magnetically "hard", while the magnetic free layer 193 is considered magnetically "soft". When the magnetic layers are antiparallel, the electrical resistance is higher than when they are aligned.

The magnetic domain wall 194, located in the magnetic free layer, separates magnetic atoms or ions oriented in a first direction from magnetic atoms or ions oriented in a second direction in opposition to the first direction.

In the first 110, second 120, and third conductance states 130, there is a mix of magnetic atoms or ions oriented the first and second directions in the magnetic free layer 193.

However, in the fourth conductance state 140, there is only magnetic atoms or ions in a single one of the first and second directions that match the directions of the magnetic atoms or ions in the second layer 191B adjacent to the magnetic free layer 193. As such, it is not easy to decrease the conductance once the analog MRAM cell 190 is in the fourth conductance state 140.

Thus, there is a need for a NVM synaptic element with a gradual RESET capability, particular with the capability of decreasing the conductance in the fourth conductance state 140. The present invention meets the aforementioned need.

Figure 2:
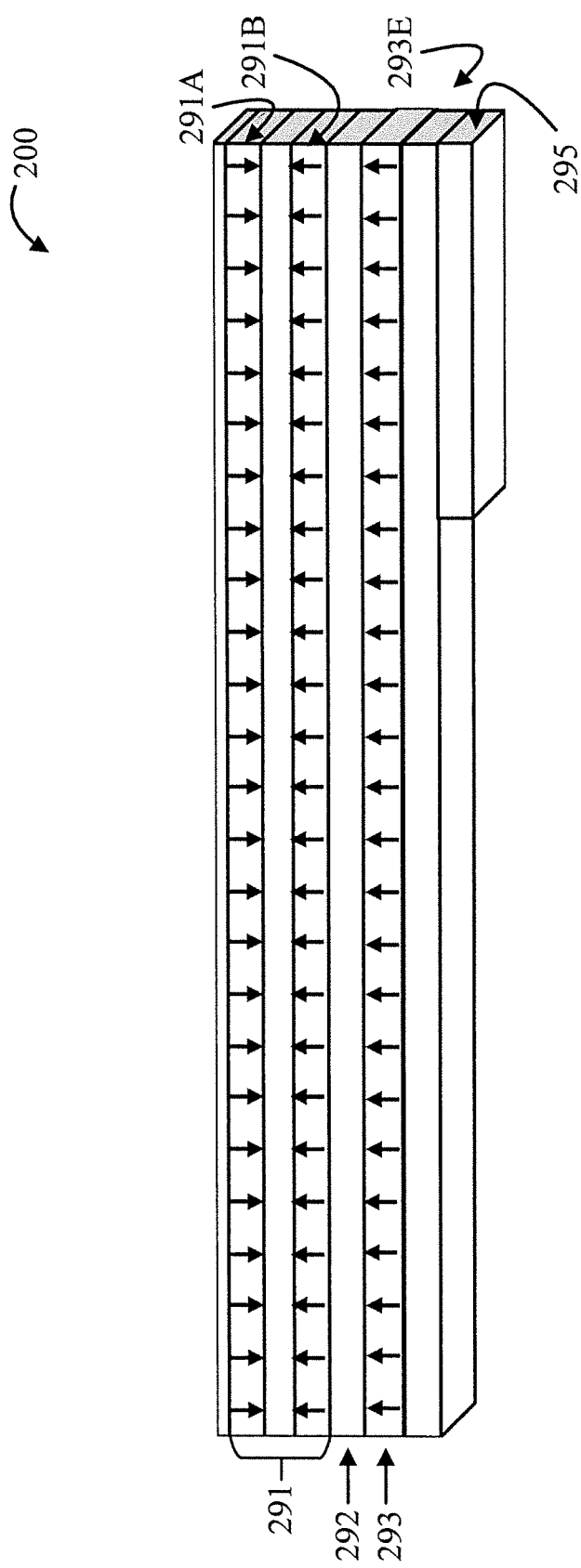
FIG. 2 is a block diagram showing an exemplary analog MRAM cell, in accordance with an embodiment of the present invention.

Referring to FIG. 2, an exemplary analog MRAM cell 200 is shown, in accordance with an embodiment of the present invention. The example of FIG. 2 relates to a case of perpendicular-magnetized MRAM.

The analog MRAM cell 200 includes a magnetically pinned layer 291, an insulating tunnel barrier layer 292, a magnetic free layer 293, a magnetic domain wall (not shown, corresponding the fourth conductance state 140 that lacks such magnetic domain wall due the existence of charge in only one orientation in the magnetic free layer 293), and an electrode 295.

The magnetically pinned layer 291 includes a first layer 291A and a second layer 291B disposed under the first layer 291B. The magnetically pinned layer 291 is formed of a antiferromagnetic material. Exemplary antiferromagnetic materials that can be used in the magnetically pinned layer 291 include, but are not limited to, any of Cobalt Platinum (CoPt), Rutheniam (Ru), Tantalum (Ta), Iron Boron (FeB), and so forth. Of course, other materials can be used. In some embodiments herein, an intermediate layer of Ru (or other antiferromagnetic material) can be disposed between first layer 291A and second layer 291B. The top pinned layer 291A is antiferromagnetically coupled with the bottom pinned layer 291B via interlayer exchange coupling with a non-magnetic layer (e.g., Ru). The purpose of the intermediate layer is to use the antiferromagnetic interlayer exchange coupling effect, which prevents read/write disturbance caused by insufficient stability of the pinned layer. In practice, the intermediate layer cannot be removed since the removal of the intermediate layer will lead to insufficient stability of the pinned layer. As the intermediate layer, Ru or Iridium (Jr) is usually used.

The insulating tunnel barrier layer 292 is formed from, but is not limited to, any of Magnesium Oxide (MgO) and so forth. Of course, other materials can be used.

The magnetic free layer 293 is formed from, but is not limited to, any of Iron Boron (FeB), Tantalum (Ta), and so forth. Of course, other materials can be used.

The domain wall, when existing, is formed in adjacent parts with different magnetic domain directions.

The electrode 295 is formed from a conductor. In an embodiment, the electrode 295 can be formed from a metal. The metal can include, but is not limited to, Titanium Nitride (TiN), Nichrome, Kanthal, and Cupronickel Of course, other materials can be used.

The MRAM cell 200 has a gradual RESET capability provided by the placement of the electrode 295 on or proximate to the magnetic free layer 293. In particular, an edge 293E of the magnetic free layer 293 is heated by the electrode 295 to randomly magnetize the edge 293E. In this way, conductance can be decreased.

Figure 3:
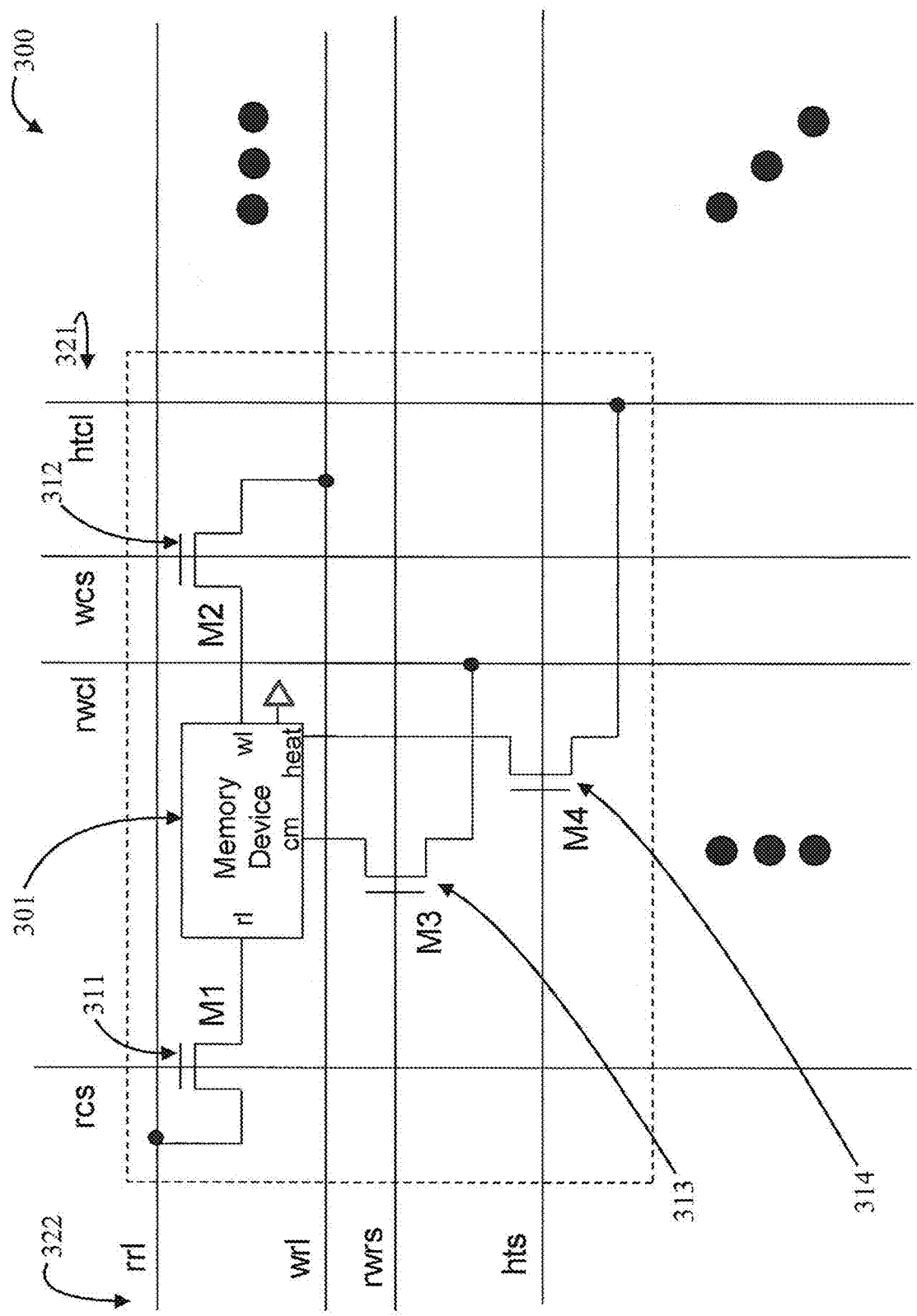
FIG. 3 is a schematic diagram of an exemplary analog MRAM cell, in accordance with an embodiment of the present invention.

Referring to FIG. 3, an exemplary analog MRAM cell 300 is shown, in accordance with an embodiment of the present invention.

The analog MRAM cell 300 includes a memory device 301, a first Metal Oxide Semiconductor Field Effect Transistor (MOSFET) 311, a second MOSFET 312, a third MOSFET 313, a fourth MOSFET 314, a set of vertically oriented control lines 321 and a set of horizontally oriented control lines 322.

Figure 4:
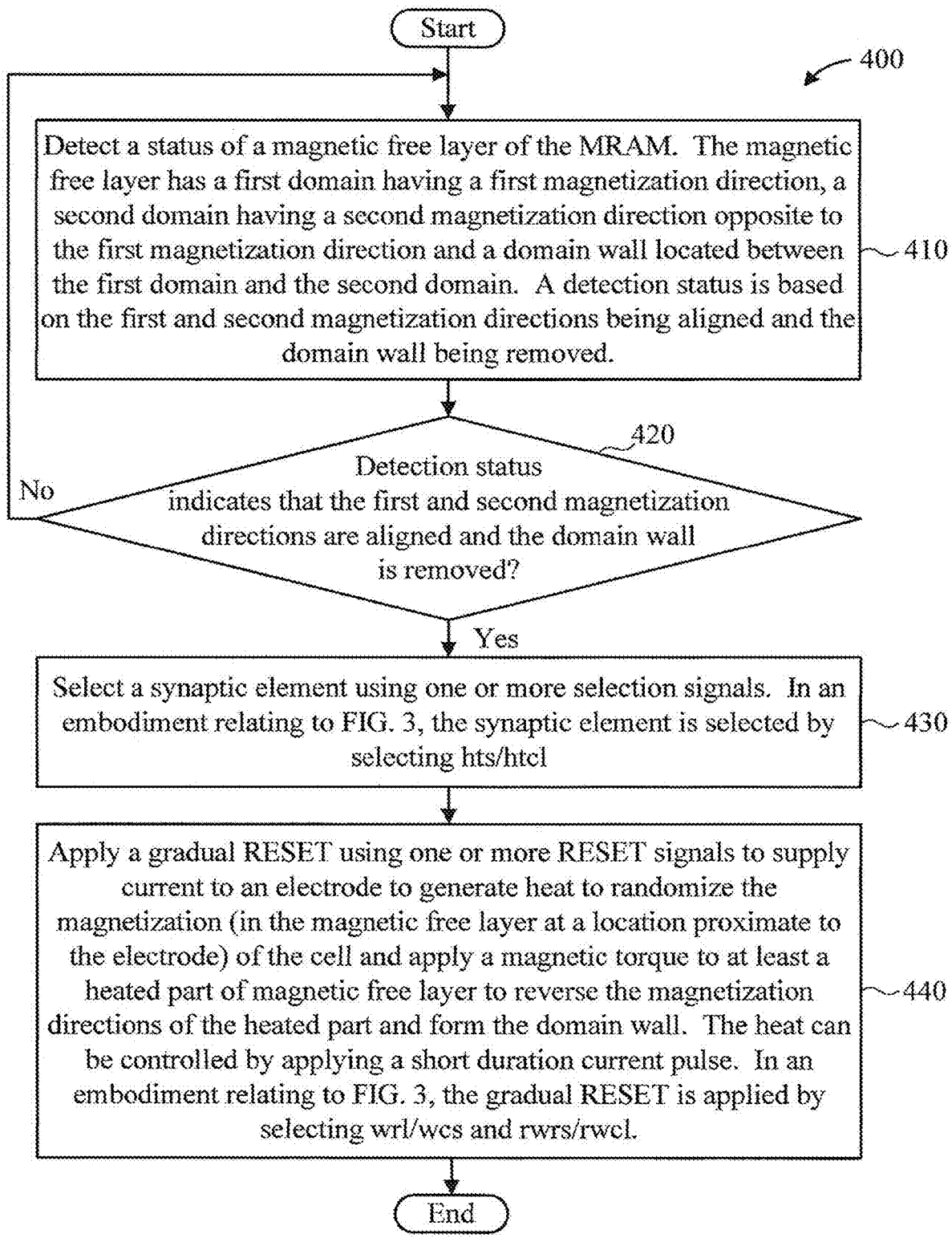
FIG. 4 is a flow diagram showing an exemplary method for performing a gradual RESET on a selected Non-Volatile Memory (NVM) element, in accordance with an embodiment of the present invention.

The memory device 301 includes the following inputs:
rl: read line input
wl: write line input
cm: common
heat: heat input The set of vertically oriented control lines 321 include the following:
res: read column select
rwcl: read write column line
wcs: write column select
htcl: heat column line The set of horizontally oriented control lines 322 include the following:
rrl: read row line
wrl: write row line
rwrs: read write row select
hts: heat select Referring to FIG. 4, an exemplary method 400 is shown for performing a gradual RESET on a selected Non-Volatile Memory (NVM) element, in accordance with an embodiment of the present invention. In an embodiment, the selected NVM element is a NVM synaptic element.

At block 410, detect a status of a magnetic free layer of the MRAM. The magnetic free layer has a first domain having a first magnetization direction, a second domain having a second magnetization direction opposite to the first magnetization direction and a domain wall located between the first domain and the second domain. A detection status is based on the first and second magnetization directions being aligned and the domain wall being removed. In an embodiment, detection is achieved based on a detected conductance of the magnetic free layer indicative of a single magnetic direction without the domain wall.

At block 420, determine whether the detection status indicates that the first and second magnetization directions are aligned and the domain wall is removed. If affirmative, proceed to block 430. Otherwise, return to block 410.

At block 430, select a synaptic element using one or more selection signals. In an embodiment relating to FIG. 3, the synaptic element is selected by selecting hts/htcl.

At block 440, apply a gradual RESET using one or more RESET signals to supply current to an electrode to generate heat to randomize the magnetization (in the magnetic free layer at a location proximate to the electrode) of the cell and apply a magnetic torque to at least a heated part of magnetic free layer to reverse the magnetization directions of the heated part and form the domain wall. The heat can be controlled by applying a short duration current pulse. For example, a current of 100 uA for 50-100 ns can be applied. Of course, other amplitudes, durations, and wave types can be applied depending upon the implementation. In an embodiment relating to FIG. 3, the gradual RESET is applied by selecting wrl/wcs and rwrs/rwcl. The RESET is described as gradual because RESET can be applied to a heated part of magnetic free layer 293.

Figure 5:
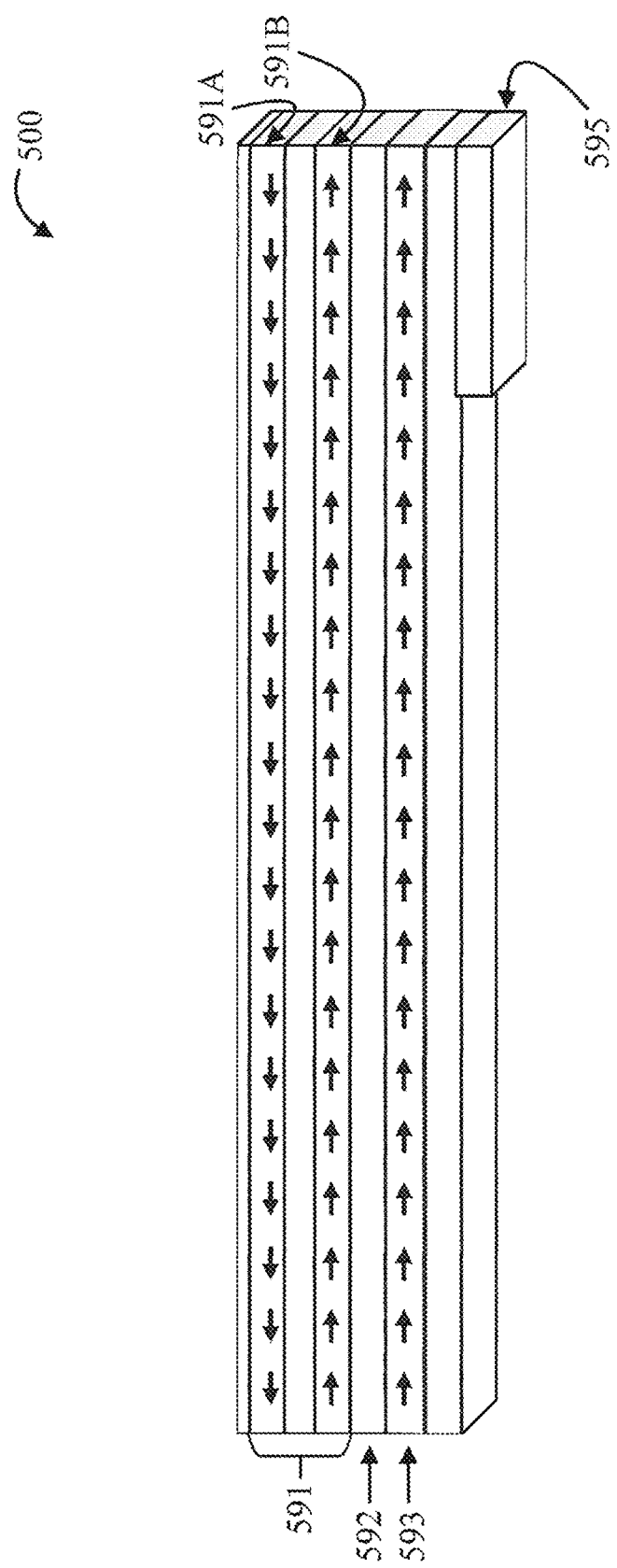
FIG. 5 is a block diagram showing an exemplary analog MRAM cell, in accordance with an embodiment of the present invention.

Referring to FIG. 5, an exemplary analog MRAM cell 500 is shown, in accordance with an embodiment of the present invention. The example of FIG. 5, in contrast to the examples of preceding FIGS. 2 and 3 and following FIG. 6, relates to a case of horizontal-magnetized MRAM.

The analog MRAM cell 500 includes a magnetically pinned layer 591 (formed of layers 591A and 591B), an insulating tunnel barrier layer 592, a magnetic free layer 593, a magnetic domain wall (not shown, corresponding the fourth conductance state 140 that lacks such magnetic domain wall due the existence of charge in only one orientation in the magnetic free layer 593), and an electrode 595.

Figure 6:
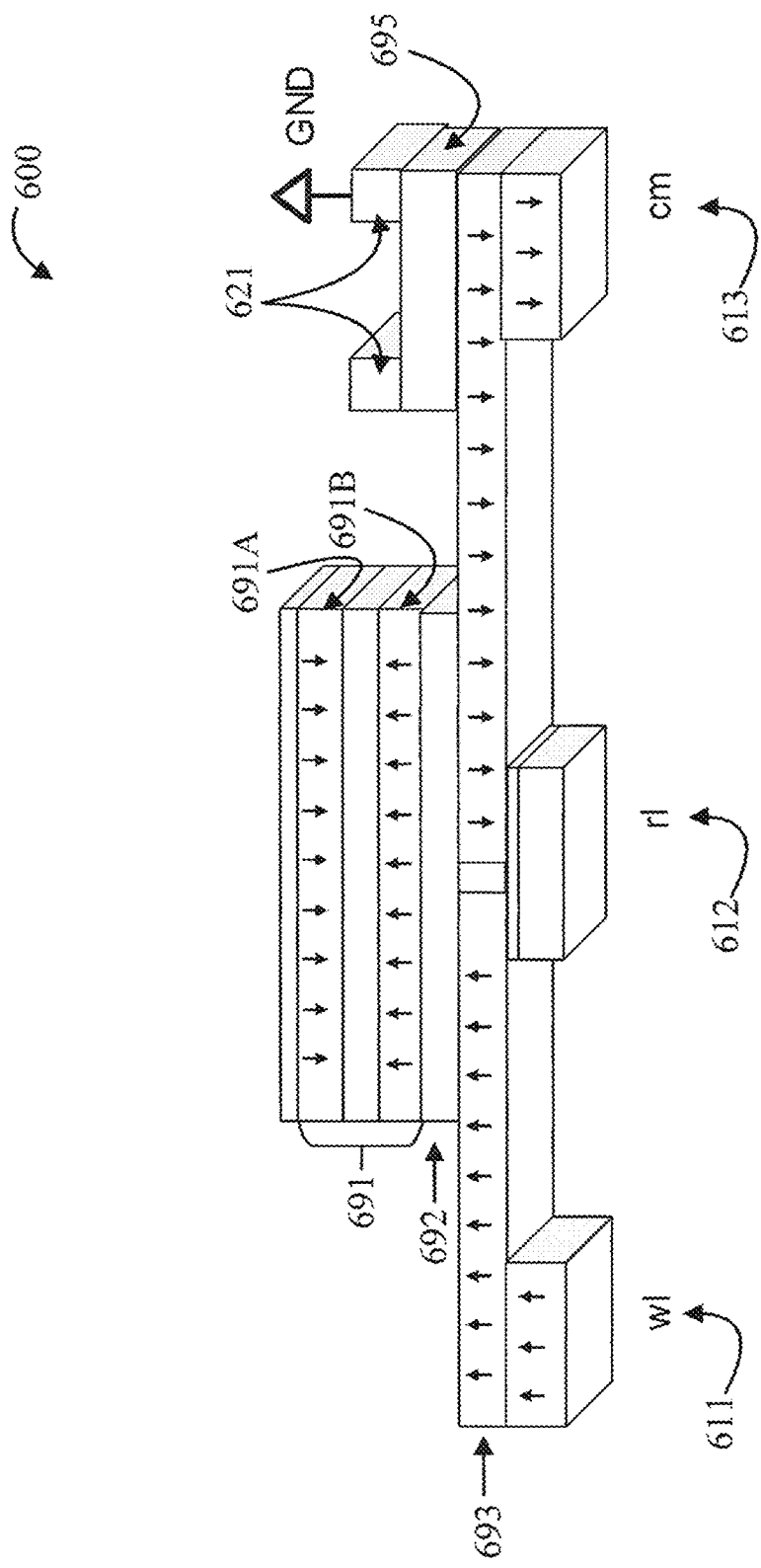
FIG. 6 is a block diagram showing an exemplary structure of an analog MRAM cell, in accordance with an embodiment of the present invention.

Referring to FIG. 6, an exemplary structure 601 of an analog MRAM cell 600 is shown, in accordance with an embodiment of the present invention. The example of FIG. 6 relates to a case of perpendicular-magnetized MRAM.

The structure 601 includes a pinned layer of synthetic antiferromagnetic material 691 (formed of layers 691A and 691B), an insulating tunnel barrier 692, a magnetic free layer 693, a magnetic domain wall 694, and an electrode 695. The structure 601 further includes a write line (wl) 611, a read line (rl) 612, and a cm 613. The electrode 695 is heated by a heating wire 621 connected to a power source at one end and ground the other end.

The wl 611 can be formed from materials such as, for example, but not limited to, copper, aluminum, and so forth.

The rl 612 can be formed from materials such as, for example, but not limited to, copper, aluminum, and so forth.

The cm 613 can be formed from materials such as, for example, but not limited to, copper, aluminum, and so forth.

The heating wire 621 can be formed from any suitable conductor including, but not limited to, copper, aluminum, and so forth.

As depicted, heating of the electrode 695 via the heating wire 621 causes randomization of the magnetic atoms or ions proximate to the electrode 695, thus causing a decrease in the conductance of the analog MRAM cell 600.

Thus, the analog NVM 600 can be taken out of the fourth conductance state 140 such that a mix of orientation directions exists in the magnetic atoms or ions in the magnetic free layer 693. The mix involves a first domain 631 having a first direction, a second domain 632 having a second direction in opposition to the first direction, and a domain wall 633 for separating the first domain 631 and second domain 632. As can be seen, such heating can result in placing the analog NVM 600 into the second conductance state 120, with the charge distribution as shown here in FIG. 6 similar to that shown in FIG. 1.

Figure 7:
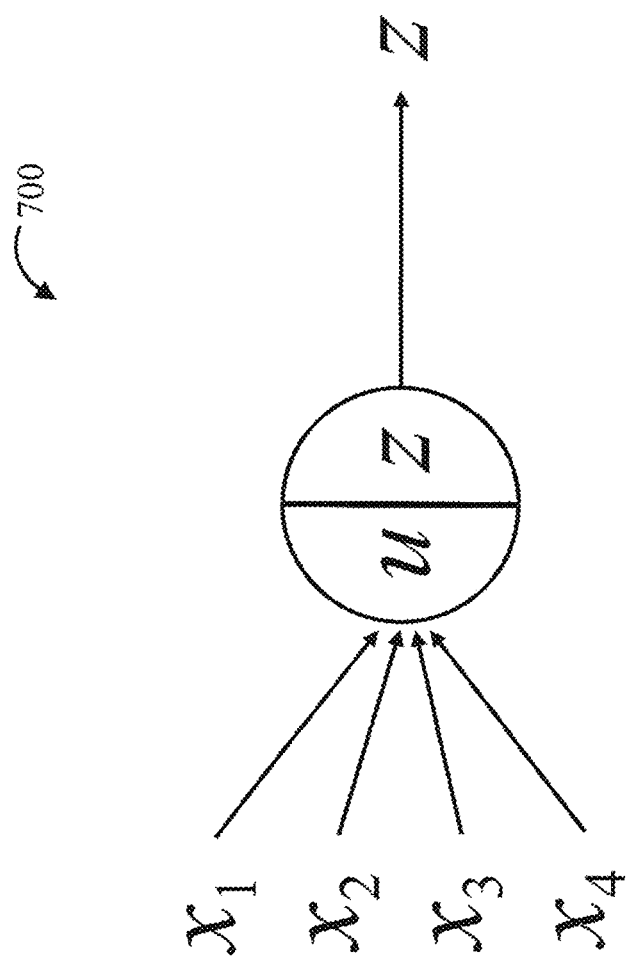
FIG. 7 is a block diagram showing an exemplary neural network unit calculation, in accordance with an embodiment of the present invention.

Embodiments of the present invention can be used for a neural network unit calculation. Referring to FIG. 7, an exemplary neural network unit calculation 700 is shown, in accordance with an embodiment of the present invention. The calculation involves an analog output. The neural network unit calculation 700 can be performed using one or more NVMs configured in accordance with an embodiment of the present invention.

Inputs to the neural network unit calculation 700 include: $x_1$; $x_2$; $x_3$; and $x_4$, where $x_1$ is a value of an i-th feature of an input vector. The output from the neural network unit calculation 700 is z. The activation function is $f(u)$, where $$u = w_1 x_1 + w_2 x_2 + w_3 x_3 + w_4 x_4$$

$$z = f(u),$$

and $w_i$ denotes an i-th weight.

Figure 8:
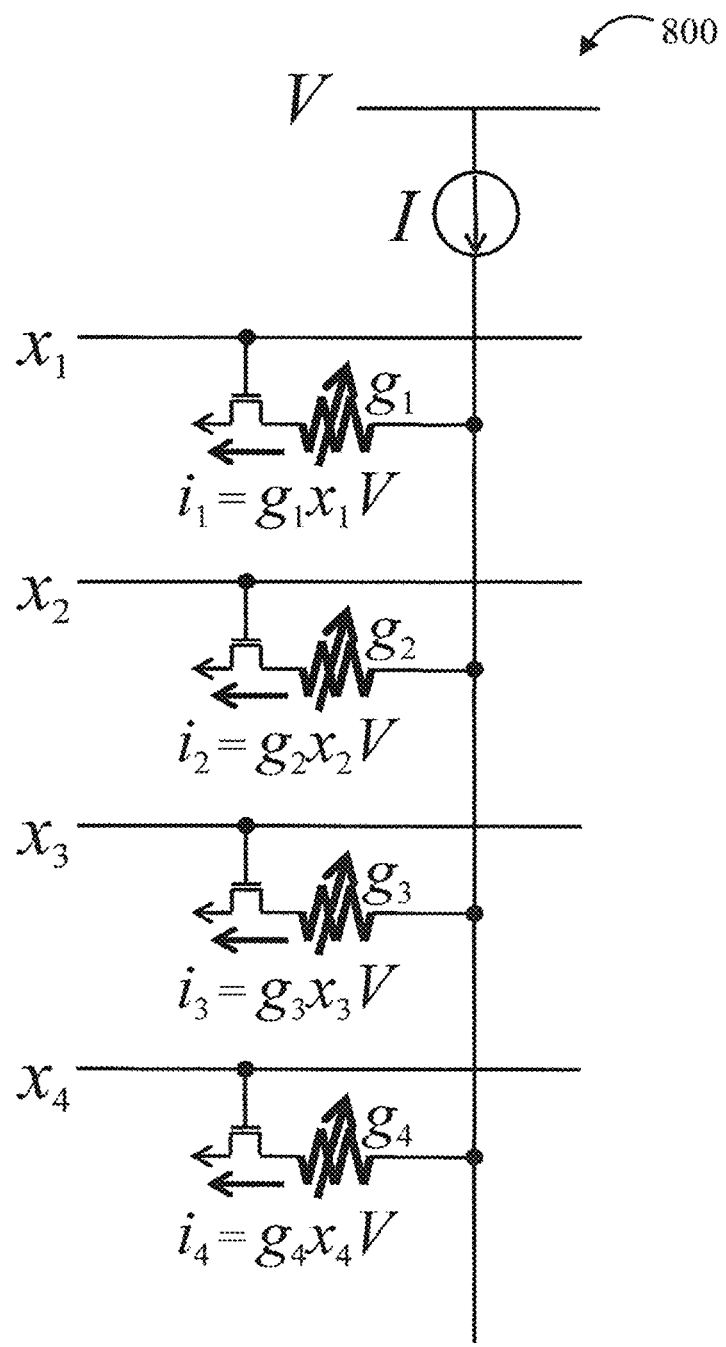
FIG. 8 is a block diagram showing an exemplary analog multiply-add operation using a NVM, in accordance with an embodiment of the present invention.

Embodiments of the present invention can be used for an analog multiply-add operation using a NVM. Referring to FIG. 8, an exemplary analog multiply-add operation 800 using a NVM 801 is shown, in accordance with an embodiment of the present invention.

The NVM 801 is coupled to a voltage source V and a current source I.

Inputs to the NVM include: $x_1$; $x_2$; $x_3$; and $x_4$, where $x_1$ is a value of an i-th feature of an input vector.

The current through an i-th element (transistor) is equal to $i_i = g_i x_i V$, where $g_i$ denotes an i-th conductance value for an i-th element.

The following equations apply:

$$I = i_1 + i_2 + i_3 + i_4$$

$$i_1 = g_1 x_1$$

$$i_2 = g_2 x_2$$

$$i_3 = g_3 x_3$$

$$i_4 = g_4 x_4$$

$$I = (g_1 x_1 + g_2 x_2 + g_3 x_3 + g_4 x_4) V$$

Figure 9:
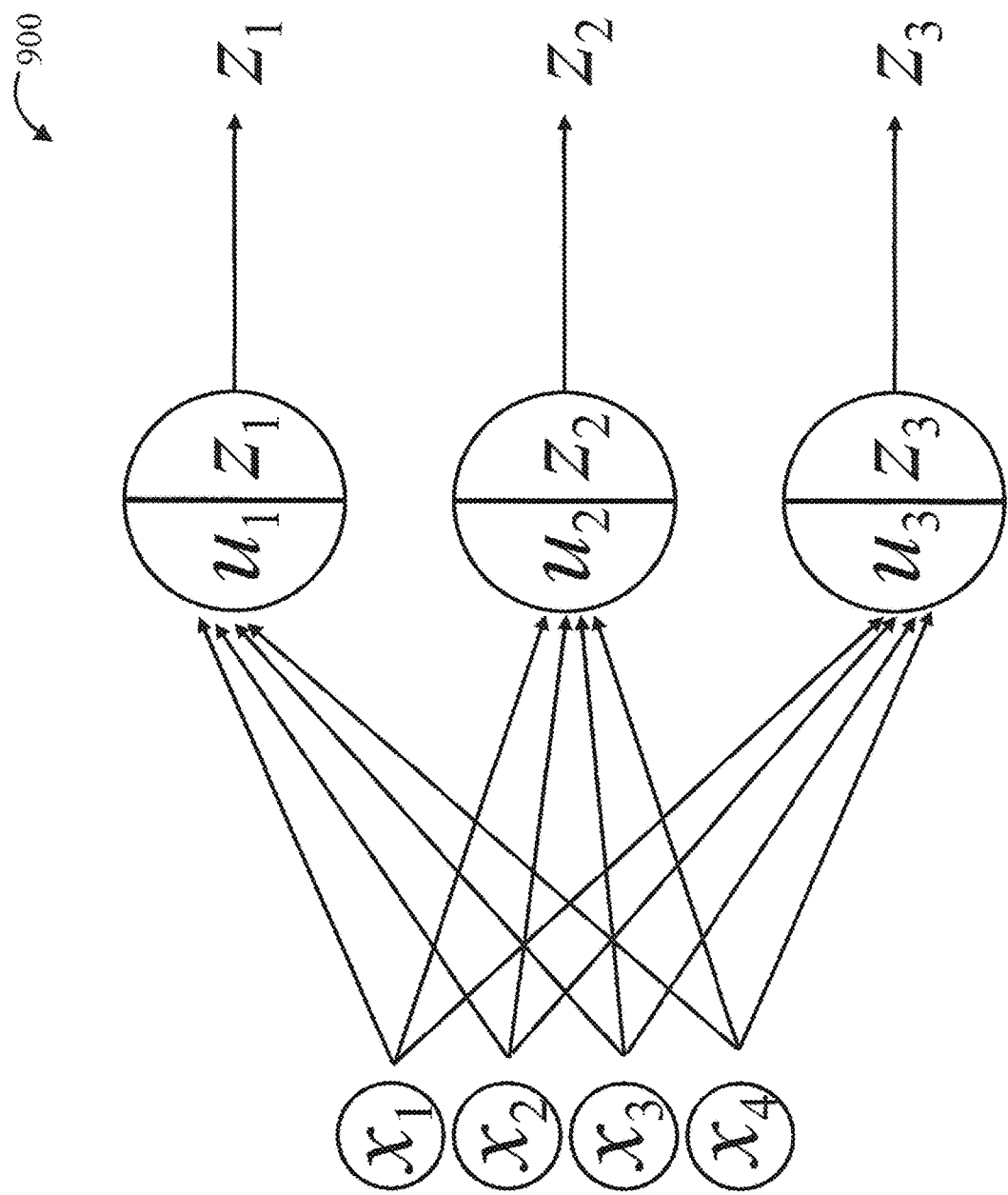
FIG. 9 is a block diagram showing an exemplary two-layer perceptron, in accordance with an embodiment of the present invention.

Embodiments of the present invention can be used for a two-layer perceptron. Referring to FIG. 9, an exemplary two-layer perceptron 900 is shown, in accordance with an embodiment of the present invention. The perceptron 900 provides an analog output.

Inputs to the two-layer perceptron 900 include: $x_1$; $x_2$; $x_3$; and $x_4$, where $x_i$ is a value of an i-th feature of an input vector. The output from the neural network unit calculation 700 is $z_1$, $z_2$, $z_3$.
The activation function for $z_1$ is $f(u_1)$,
the activation function for $z_2$ is $f(u_2)$,
the activation function for $z_3$ is $f(u_3)$,
where $$u_1 = w_{11}x_1 + w_{12}x_2 + w_{13}x_3 + w_{14}x_4$$

$$u_2 = w_{21}x_1 + w_{22}x_2 + w_{23}x_3 + w_{24}x_4$$

$$u_3 = w_{31}x_1 + w_{32}x_2 + w_{33}x_3 + w_{34}x_4$$

and $w_{ij}$ denotes an i-th weight of a j-th feature vector.

Figure 10:
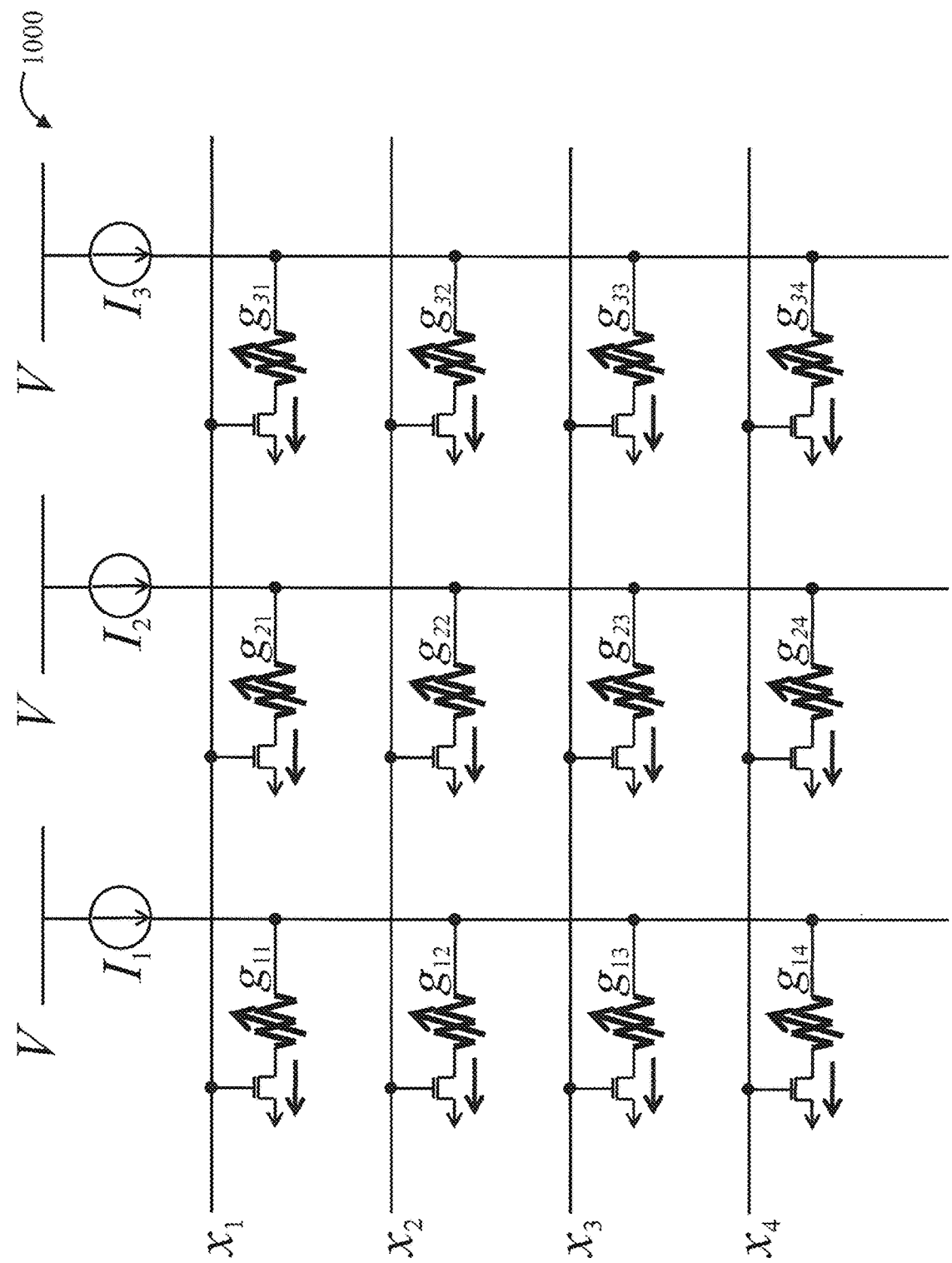
FIG. 10 is a block diagram showing an exemplary analog multiply-add operations using multiple NVMs, in accordance with an embodiment of the present invention.

Embodiments of the present invention can be used for analog multiply-add operations with multiple NVMs. Referring to FIG. 10, exemplary analog multiply-add operations 1001-1003 using multiple NVMs 1011-1013 are shown, in accordance with an embodiment of the present invention.

A first analog multiply-add operation 1001 involves conductances $g_{11}$, $g_{12}$, $g_{13}$, and $g_{14}$.

A second analog multiply-add operation 1002 involves conductances $g_{21}$, $g_{22}$, $g_{23}$, and $g_{24}$.

A third analog multiply-add operation 1003 involves conductances $g_{31}$, $g_{32}$, $g_{33}$, and $g_{34}$.

The current through an i-th element (transistor) is equal to $i_1 = g_{ij} x_i V$,
where
$g_{ij}$ denotes an i-th conductance value for an j-th column.

The following equations apply:

$$I = i_1 + i_2 + i_3$$

$$I_1 = (g_{11} \times x_1 + g_{12}x_2 + g_{13}x_3 + g_{14}x_4)V$$

$$I_2 = (g_{21}x_1 + g_{22}x_2 + g_{23}x_3 + g_{24}x_4)V$$

$$I_3 = (g_{31}x_1 + g_{32}x_2 + g_{33}x_3 + g_{34}x_4)V$$

In an embodiment, $I_1$, $I_2$, and $I_3$ are used independently (that is, without computation of I).

Figure 11:
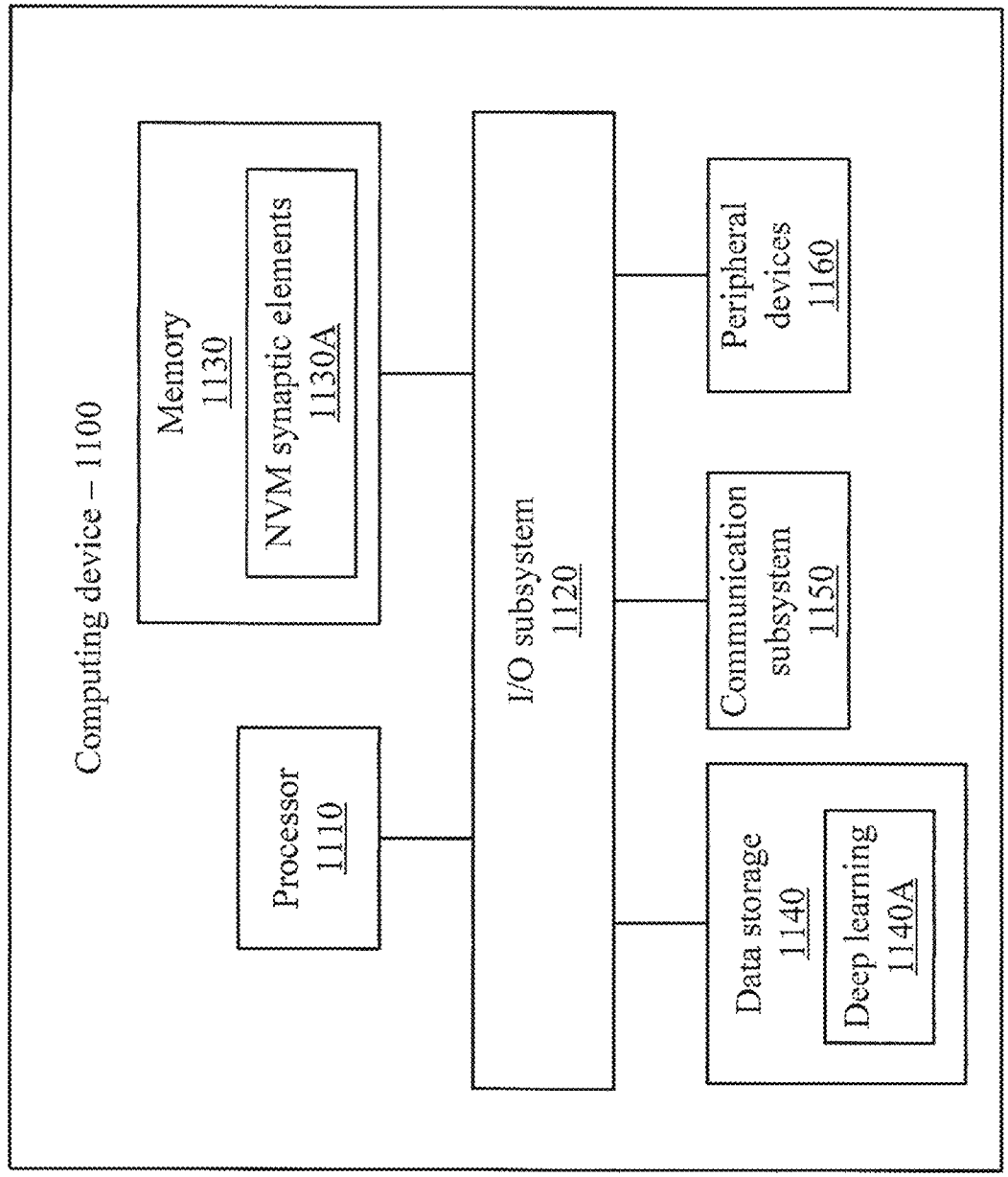
FIG. 11 shows an exemplary computing device to which the present invention may be applied, in accordance with an embodiment of the present invention.

Referring to FIG. 11, an exemplary computing device 1100 is shown, in accordance with an embodiment of the present invention. The computing device 1100 is configured to deep learning and includes NVM synaptic elements 130A in memory 130, where the NVM synaptic element have a gradual RESET capability. In particular, the NVM synaptic elements are capable of selective RESET (e.g., a subset of a set of NVM synaptic cells), and can decrease conductance even when the selected synaptic elements are in conductance state 140.

The computing device 1100 may be embodied as any type of computation or computer device capable of performing the functions described herein, including, without limitation, a computer, a server, a rack based server, a blade server, a workstation, a desktop computer, a laptop computer, a notebook computer, a tablet computer, a mobile computing device, a wearable computing device, a network appliance, a web appliance, a distributed computing system, a processor-based system, and/or a consumer electronic device. Additionally or alternatively, the computing device 200 may be embodied as a one or more compute sleds, memory sleds, or other racks, sleds, computing chassis, or other components of a physically disaggregated computing device. As shown in FIG. 11, the computing device 1100 illustratively includes the processor 1110, an input/output subsystem 1120, a memory 1130, a data storage device 1140, and a communication subsystem 1150, and/or other components and devices commonly found in a server or similar computing device. Of course, the computing device 1100 may include other or additional components, such as those commonly found in a server computer (e.g., various input/output devices), in other embodiments. Additionally, in some embodiments, one or more of the illustrative components may be incorporated in, or otherwise form a portion of, another component. For example, the memory 1130, or portions thereof, may be incorporated in the processor 1110 in some embodiments.

The processor 1110 may be embodied as any type of processor capable of performing the functions described herein. The processor 1110 may be embodied as a single processor, multiple processors, a Central Processing Unit(s) (CPU(s)), a Graphics Processing Unit(s) (GPU(s)), a single or multi-core processor(s), a digital signal processor(s), a microcontroller(s), or other processor(s) or processing/controlling circuit(s).

The memory 1130 may be embodied as any type of volatile or non-volatile memory or data storage capable of performing the functions described herein. In operation, the memory 1130 may store various data and software used during operation of the computing device 1100, such as operating systems, applications, programs, libraries, and drivers. The memory 1130 is communicatively coupled to the processor 1110 via the I/O subsystem 1120, which may be embodied as circuitry and/or components to facilitate input/output operations with the processor 1110 the memory 1130, and other components of the computing device 1100. For example, the I/O subsystem 1120 may be embodied as, or otherwise include, memory controller hubs, input/output control hubs, platform controller hubs, integrated control circuitry, firmware devices, communication links (e.g., point-to-point links, bus links, wires, cables, light guides, printed circuit board traces, etc.) and/or other components and subsystems to facilitate the input/output operations. In some embodiments, the I/O subsystem 1120 may form a portion of a system-on-a-chip (SOC) and be incorporated, along with the processor 1110, the memory 1130, and other components of the computing device 1100, on a single integrated circuit chip.

The data storage device 1140 may be embodied as any type of device or devices configured for short-term or long-term storage of data such as, for example, memory devices and circuits, memory cards, hard disk drives, solid state drives, or other data storage devices. The data storage device 1140 can store program code for a deep learning algorithm 1140A that uses one or more NVM synaptic elements with a gradual RESET capability. Part or all of the program code 1140A can be stored in the memory 1130. The communication subsystem 1150 of the computing device 1100 may be embodied as any network interface controller or other communication circuit, device, or collection thereof, capable of enabling communications between the computing device 1100 and other remote devices over a network. The communication subsystem 1150 may be configured to use any one or more communication technology (e.g., wired or wireless communications) and associated protocols (e.g., Ethernet, InfiniBand®, Bluetooth®, Wi-Fi®, WiMAX, etc.) to effect such communication.

As shown, the computing device 1100 may also include one or more peripheral devices 1160. The peripheral devices 1160 may include any number of additional input/output devices, interface devices, and/or other peripheral devices. For example, in some embodiments, the peripheral devices 1160 may include a display, touch screen, graphics circuitry, keyboard, mouse, speaker system, microphone, network interface, and/or other input/output devices, interface devices, and/or peripheral devices.

Of course, the computing device 1100 may also include other elements (not shown), as readily contemplated by one of skill in the art, as well as omit certain elements. For example, various other input devices and/or output devices can be included in computing device 1100, depending upon the particular implementation of the same, as readily understood by one of ordinary skill in the art. For example, various types of wireless and/or wired input and/or output devices can be used. Moreover, additional processors, controllers, memories, and so forth, in various configurations can also be utilized. These and other variations of the processing system 1100 are readily contemplated by one of ordinary skill in the art given the teachings of the present invention provided herein.

As employed herein, the term "hardware processor subsystem" or "hardware processor" can refer to a processor, memory (including RAM, cache(s), and so forth), software (including memory management software) or combinations thereof that cooperate to perform one or more specific tasks. In useful embodiments, the hardware processor subsystem can include one or more data processing elements (e.g., logic circuits, processing circuits, instruction execution devices, etc.). The one or more data processing elements can be included in a central processing unit, a graphics processing unit, and/or a separate processor- or computing element-based controller (e.g., logic gates, etc.). The hardware processor subsystem can include one or more on-board memories (e.g., caches, dedicated memory arrays, read only memory, etc.). In some embodiments, the hardware processor subsystem can include one or more memories that can be on or off board or that can be dedicated for use by the hardware processor subsystem (e.g., ROM, RAM, basic input/output system (BIOS), etc.).

In some embodiments, the hardware processor subsystem can include and execute one or more software elements. The one or more software elements can include an operating system and/or one or more applications and/or specific code to achieve a specified result.

In other embodiments, the hardware processor subsystem can include dedicated, specialized circuitry that performs one or more electronic processing functions to achieve a specified result. Such circuitry can include one or more application-specific integrated circuits (ASICs), FPGAs, and/or PLAs.

Figure 12:
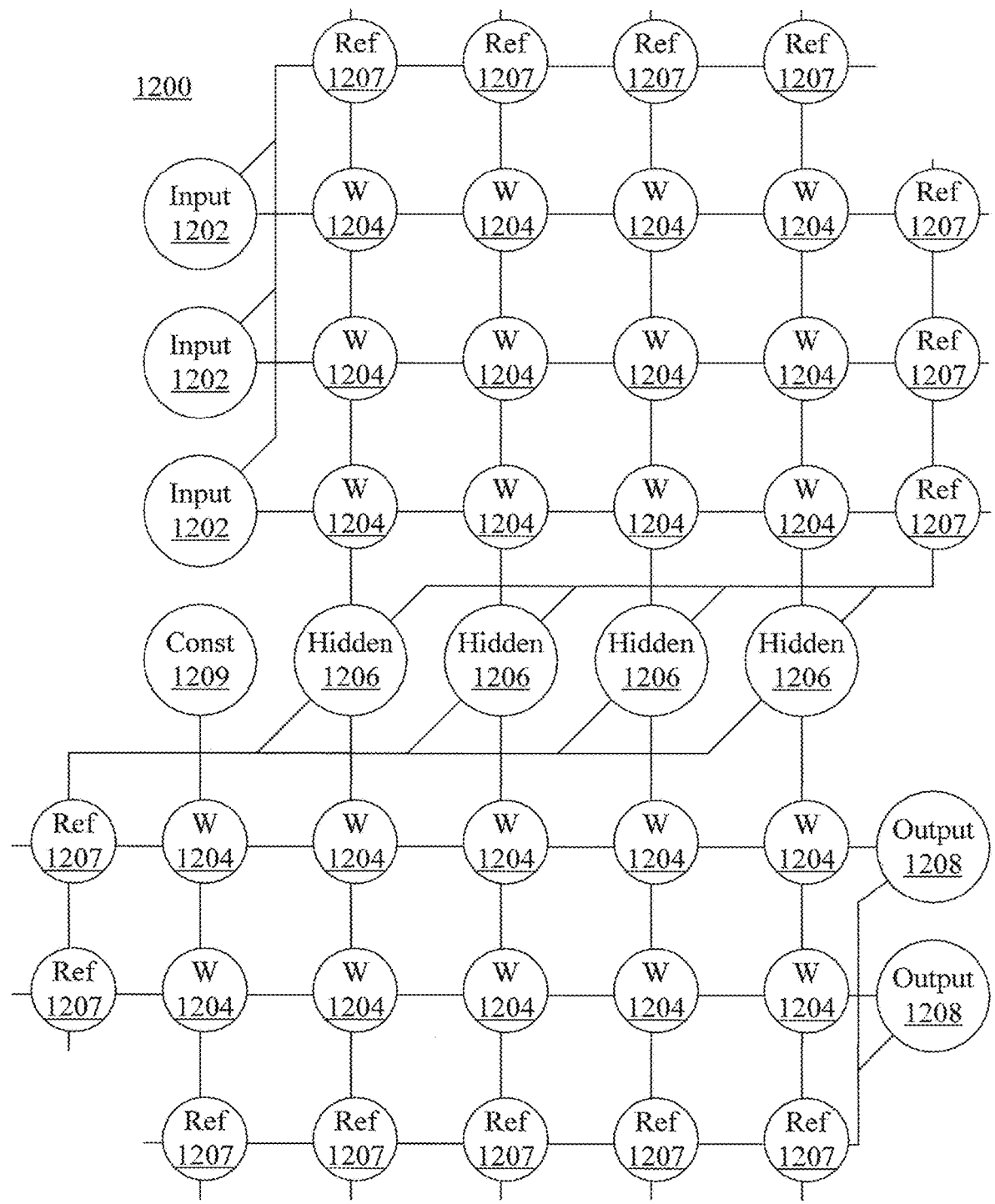
FIG. 12 is a block diagram showing an exemplary Artificial Neural Network (ANN) architecture, in accordance with an embodiment of the present invention.

These and other variations of a hardware processor subsystem are also contemplated in accordance with embodiments of the present invention Referring to FIG. 12, an exemplary Artificial Neural Network (ANN) architecture 1200 is shown, in accordance with an embodiment of the present invention. It should be understood that the present architecture is purely exemplary and that other architectures or types of neural network can be used instead. In particular, while a hardware embodiment of an ANN is described herein, it should be understood that neural network architectures can be implemented or simulated in software. The hardware embodiment described herein is included with the intent of illustrating general principles of neural network computation at a high level of generality and should not be construed as limiting in any way.

Furthermore, the layers of neurons described below and the weights connecting them are described in a general manner and can be replaced by any type of neural network layers with any appropriate degree or type of interconnectivity. For example, layers can include convolutional layers, pooling layers, fully connected layers, softmax layers, or any other appropriate type of neural network layer. Furthermore, layers can be added or removed as needed and the weights can be omitted for more complicated forms of interconnection.

During feed-forward operation, a set of input neurons 1202 each provide an input voltage in parallel to a respective row of weights 1204. In the hardware embodiment described herein, the weights 1204 each have a settable resistance value, such that a current output flows from the weight 1204 to a respective hidden neuron 1206 to represent the weighted input. In software embodiments, the weights 1204 can simply be represented as coefficient values that are multiplied against the relevant neuron outputs.

Following the hardware embodiment, the current output by a given weight 1204 is determined as $$I = \frac{V}{r},$$

where V is the input voltage from the input neuron 1202 and r is the set resistance of the weight 11204. The current from each weight adds column-wise and flows to a hidden neuron 1206. A set of reference weights 1207 have a fixed resistance and combine their outputs into a reference current that is provided to each of the hidden neurons 1206. Because conductance values can only be positive numbers, some reference conductance is needed to encode both positive and negative values in the matrix. The currents produced by the weights 1204 are continuously valued and positive, and therefore the reference weights 1207 are used to provide a reference current, above which currents are considered to have positive values and below which currents are considered to have negative values. The use of reference weights 1207 is not needed in software embodiments, where the values of outputs and weights can be precisely and directly obtained. As an alternative to using the reference weights 1207, another embodiment can use separate arrays of weights 1204 to capture negative values.

The hidden neurons 1206 use the currents from the array of weights 1204 and the reference weights 1207 to perform some calculation. The hidden neurons 1206 then output a voltage of their own to another array of weights 1204. This array performs in the same way, with a column of weights 1204 receiving a voltage from their respective hidden neuron 1206 to produce a weighted current output that adds row-wise and is provided to the output neuron 1208.

It should be understood that any number of these stages can be implemented, by interposing additional layers of arrays and hidden neurons 1206. It should also be noted that some neurons can be constant neurons 1209, which provide a constant output to the array. The constant neurons 1209 can be present among the input neurons 1202 and/or hidden neurons 1206 and are only used during feed-forward operation.

During back propagation, the output neurons 1208 provide a voltage back across the array of weights 1204. The output layer compares the generated network response to training data and computes an error. The error is applied to the array as a voltage pulse, where the height and/or duration of the pulse is modulated proportional to the error value. In this example, a row of weights 1204 receives a voltage from a respective output neuron 1208 in parallel and converts that voltage into a current which adds column-wise to provide an input to hidden neurons 1206. The hidden neurons 1206 combine the weighted feedback signal with a derivative of its feed-forward calculation and stores an error value before outputting a feedback signal voltage to its respective column of weights 1204. This back propagation travels through the entire network 1200 until all hidden neurons 1206 and the input neurons 1202 have stored an error value.

During weight updates, the input neurons 1202 and hidden neurons 1206 apply a first weight update voltage forward and the output neurons 1208 and hidden neurons 1206 apply a second weight update voltage backward through the network 1200. The combinations of these voltages create a state change within each weight 1204, causing the weight 1204 to take on a new resistance value. In this manner the weights 1204 can be trained to adapt the neural network 1200 to errors in its processing. It should be noted that the three modes of operation, feed forward, back propagation, and weight update, do not overlap with one another.

As noted above, the weights 1204 can be implemented in software or in hardware, for example using relatively complicated weighting circuitry or using resistive cross point devices. Such resistive devices can have switching characteristics that have a non-linearity that can be used for processing data. The weights 1204 can belong to a class of device called a resistive processing unit (RPU), because their non-linear characteristics are used to perform calculations in the neural network 1200. The RPU devices can be implemented with resistive random access memory (RRAM), phase change memory (PCM), programmable metallization cell (PMC) memory, or any other device that has non-linear resistive switching characteristics. Such RPU devices can also be considered as memristive systems.

Figure 13:
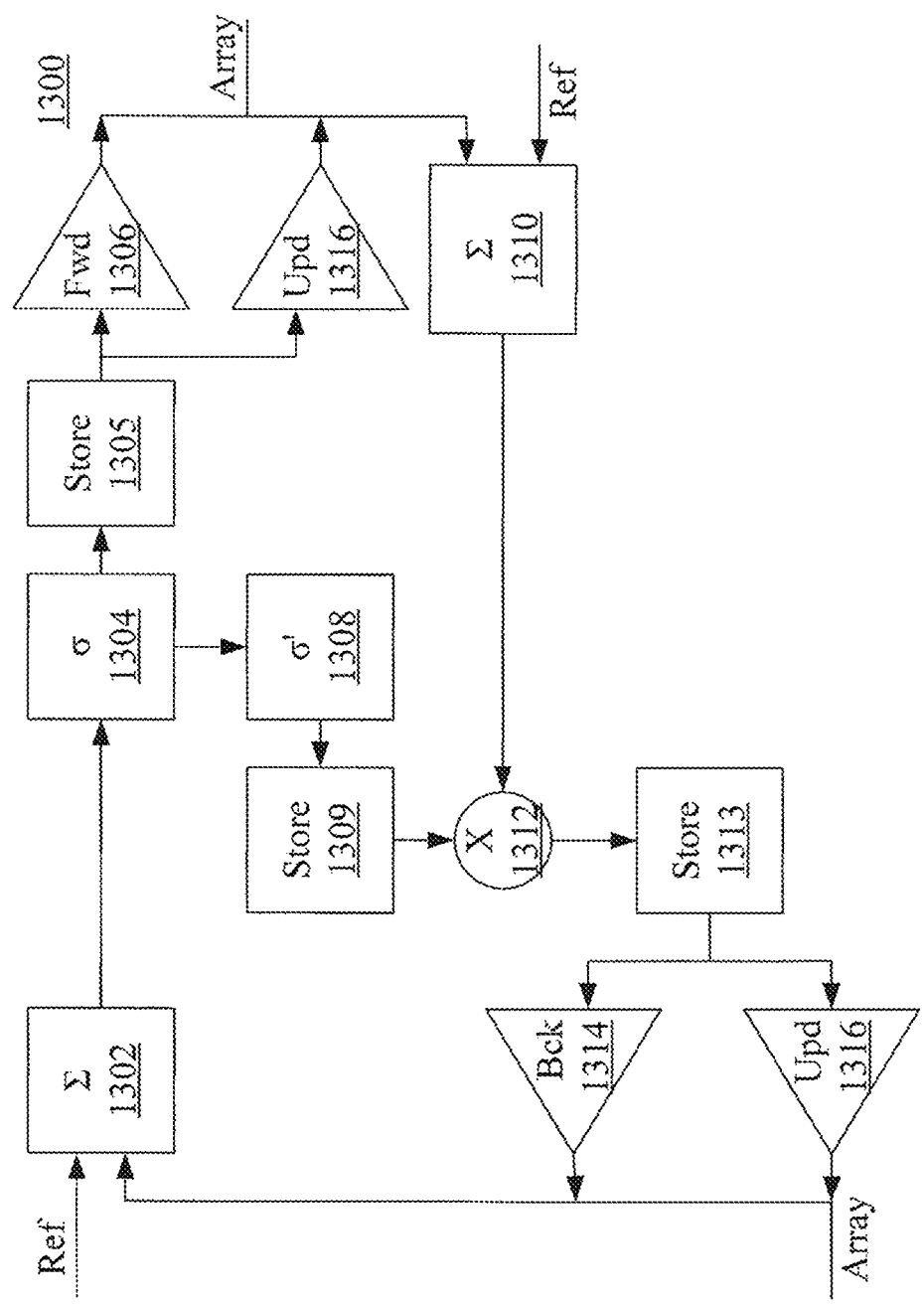
FIG. 13 is a block diagram showing an exemplary neuron, in accordance with an embodiment of the present invention.

Referring to FIG. 13, an exemplary neuron 1300 is shown, in accordance with an embodiment of the present invention. This neuron can represent any of the input neurons 1202, the hidden neurons 1206, or the output neurons 1208. It should be noted that FIG. 13 shows components to address all three phases of operation: feed forward, back propagation, and weight update. However, because the different phases do not overlap, there will necessarily be some form of control mechanism within the neuron 1300 to control which components are active. It should therefore be understood that there can be switches and other structures that are not shown in the neuron 1300 to handle switching between modes.

In feed forward mode, a difference block 1302 determines the value of the input from the array by comparing it to the reference input. This sets both a magnitude and a sign (e.g., + or −) of the input to the neuron 1300 from the array. Block 1304 performs a computation based on the input, the output of which is stored in storage 1305. It is specifically contemplated that block 1304 computes a non-linear function and can be implemented as analog or digital circuitry or can be performed in software. The value determined by the function block 1304 is converted to a voltage at feed forward generator 1306, which applies the voltage to the next array. The signal propagates this way by passing through multiple layers of arrays and neurons until it reaches the final output layer of neurons. The input is also applied to a derivative of the non-linear function in block 1308, the output of which is stored in memory 1309.

During back propagation mode, an error signal is generated. The error signal can be generated at an output neuron 1208 or can be computed by a separate unit that accepts inputs from the output neurons 1208 and compares the output to a correct output based on the training data. Otherwise, if the neuron 1300 is a hidden neuron 1206, it receives back propagating information from the array of weights 1204 and compares the received information with the reference signal at difference block 1310 to provide a continuously valued, signed error signal. This error signal is multiplied by the derivative of the non-linear function from the previous feed forward step stored in memory 1309 using a multiplier 1312, with the result being stored in the storage 1313. The value determined by the multiplier 1312 is converted to a backwards propagating voltage pulse proportional to the computed error at back propagation generator 1314, which applies the voltage to the previous array. The error signal propagates in this way by passing through multiple layers of arrays and neurons until it reaches the input layer of neurons 1202.

During weight update mode, after both forward and backward passes are completed, each weight 1204 is updated proportional to the product of the signal passed through the weight during the forward and backward passes. The update signal generators 1316 provide voltage pulses in both directions (though note that, for input and output neurons, only one direction will be available). The shapes and amplitudes of the pulses from update generators 1316 are configured to change a state of the weights 1204, such that the resistance of the weights 1204 is updated.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements may be included in the compound and still function in accordance with the present principles. The compounds with additional elements will be referred to herein as alloys.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, may be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly. In addition, it will also be understood that when a layer is referred to as being "between" two layers, it can be the only layer between the two layers, or one or more intervening layers may also be present.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. An analog Magnetoresistive Random Access Memory (MRAM) cell comprising:
   a magnetic free layer having a first domain having a first magnetization direction, a second domain having a second magnetization direction opposite to the first magnetization direction and a domain wall located between the first domain and the second domain;
   a magnetically pinned layer;
   an insulating tunnel barrier between the magnetic free layer and the magnetically pinned layer; and
   an electrode located adjacent to the magnetic free layer configured to generate heat by supplying current to decrease a conductance of the magnetic free layer.

2. The analog MRAM cell of claim 1, wherein the magnetic pinned layer comprises at least one an antiferromagnetic material.

3. The analog MRAM cell of claim 1, wherein the first and second domains comprise magnetic elements.

4. The analog MRAM cell of claim 1, wherein the analog MRAM cell is comprised in a synaptic element.

5. The analog MRAM cell of claim 4, wherein the electrode decreases the conductance of the magnetic free layer of only the synaptic element from among a plurality of synaptic elements.

6. The analog MRAM cell of claim 5, further comprising selection circuitry configured to select only the synaptic element for a conductance decrease from among the plurality of synaptic elements.

7. The analog MRAM cell of claim 1, wherein the analog MRAM is horizontal-magnetized.

8. The analog MRAM cell of claim 1, wherein the analog MRAM is perpendicular-magnetized.

9. The analog MRAM cell of claim 1, wherein the electrode is contact with a portion of the magnetic free layer.

10. The analog MRAM cell of claim 1, further comprising at least one heat control transistor configured to control an application of current to the electrode.

11. The analog MRAM cell of claim 10, wherein the at least one heat control transistor is configured to supply current to the electrode responsive to respective control signals applied to a gate and a drain of the at least one heat control transistor.

12. The analog MRAM cell of claim 1, wherein the electrode is placed at a first end from among the first end and a second end to randomize a magnetization direction at least the first end.

13. The analog MRAM cell of claim 1, wherein the electrode is configured to generate heat by supplying the current to decrease the conductance of the magnetic free layer to randomize a magnetization direction of at least a portion of the magnetic free layer.

14. The analog MRAM cell of claim 1, wherein the analog MRAM cell is integrated in a large scale integrated circuit.

15. The analog MRAM cell of claim 1, wherein a generation of heat from the electrode creates a local magnetic field only in the analog MRAM cell from among a plurality of MRAM cells forming a memory array.

16. The analog MRAM cell of claim 1, wherein each of the plurality of analog MRAM cells is comprised in respective a synaptic element from among a plurality of synaptic elements.

17. The analog MRAM cell of claim 16, wherein the electrode decreases the conductance of the magnetic free layer of only selected ones of the plurality of synaptic elements.

18. The analog MRAM cell of claim 17, further comprising selection circuitry configured to select one or more but less than all of the plurality of synaptic elements for a conductance decrease.

19. A method for resetting an analog MRAM, comprising:
    detecting a status of a magnetic free layer of the analog MRAM, the magnetic free layer having a first domain having a first magnetization direction, a second domain having a second magnetization direction opposite to the first magnetization direction and a domain wall located between the first domain and the second domain, wherein a detection status is based on the first and second magnetization directions being aligned and the domain wall being removed; and
    supplying current to an electrode to generate heat to randomize the magnetization of the cell and applying a magnetic torque to at least a heated part of magnetic free layer to reverse the magnetization directions of the heated part and form the domain wall responsive to the first and second magnetization directions being aligned and the domain wall being removed.

20. The method of claim 19, further comprising applying one or more control signals to selection circuitry configured to select only the analog NVM for a conductance decrease from among the plurality of NVMs.

21. The method of claim 20, wherein the magnetic field is a local magnetic field applied only to the analog NVM from among the plurality of NVMs through application of the current to the electrode.

22. The method of claim 19, wherein said supply step comprising using the electrode to generate heat by supplying the current to decrease the conductance of the magnetic free layer to randomize a magnetization direction of at least a portion of the magnetic free layer.

23. An analog Magnetoresistive Random Access Memory (MRAM), comprising:
    a plurality of MRAM cells, each of the cells comprising
        a magnetic free layer having a first domain having a first magnetization direction, a second domain having a second magnetization direction opposite to the first magnetization direction and a domain wall located between the first domain and the second domain;
        a magnetically pinned layer;
        an insulating tunnel barrier between the magnetic free layer and the magnetically pinned layer; and
        an electrode located adjacent to the magnetic free layer configured to generate heat by supplying current to decrease a conductance of the magnetic free layer.

24. The analog MRAM of claim 23, wherein each of the plurality of MRAM cells is coupled to respective heat selection circuitry for heating the electrode of a selected one or more of the plurality of MRAM cells.

25. A method for resetting an analog Magnetoresistive Random Access Memory (MRAM) having a plurality of MRAM cells, comprising:
    detecting a status of a magnetic free layer of each of the plurality of MRAM cells, the magnetic free layer having a first domain having a first magnetization direction, a second domain having a second magnetization direction opposite to the first magnetization direction and a domain wall located between the first domain and the second domain, wherein a detection status is based on the first and second magnetization directions being aligned and the domain wall being removed;
    selecting one or more of the plurality of MRAM cells for a RESET operation, responsive to the first and second magnetization directions being aligned and the domain wall being removed; and
    supplying current to an electrode of the selected one or more of the plurality of MRAM cells to generate heat to randomize the magnetization of the cell and applying a magnetic torque to at least a heated part of magnetic free layer to reverse the magnetization directions of the heated part and form the domain wall.

* * * * *